(12) United States Patent
Okihara

(10) Patent No.: US 6,849,883 B2
(45) Date of Patent: Feb. 1, 2005

(54) STRAINED SOI MOSFET DEVICE AND METHOD OF FABRICATING SAME

(75) Inventor: Masao Okihara, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/392,930

(22) Filed: Mar. 21, 2003

(65) Prior Publication Data

US 2004/0041174 A1 Mar. 4, 2004

(30) Foreign Application Priority Data

Sep. 2, 2002 (JP) ........................ 2002-256512

(51) Int. Cl.[7] .......................................... H01L 31/072
(52) U.S. Cl. .................. 257/192; 257/190; 257/194; 257/195; 257/347; 257/350; 257/371; 257/616; 438/172; 438/199; 438/275; 438/279; 438/528
(58) Field of Search ................ 257/190, 192, 257/194–195, 347, 350, 371, 616, E29.193, E31.049, 93, 374, 446, 499–564, 395–399, 510–521, 305, 333, 389, 632–651; 438/172, 199, 275, 279, 528

(56) References Cited

U.S. PATENT DOCUMENTS

| 4,994,866 | A | * | 2/1991 | Awano ...................... 257/190 |
| 6,059,895 | A | | 5/2000 | Chu et al. |
| 6,165,849 | A | * | 12/2000 | An et al. .................... 438/275 |
| 6,362,059 | B2 | * | 3/2002 | Fukasaku et al. ........... 438/289 |
| 6,380,590 | B1 | | 4/2002 | Yu |
| 6,509,587 | B2 | * | 1/2003 | Sugiyama et al. .......... 257/192 |
| 6,709,932 | B1 | * | 3/2004 | Krishnan et al. ........... 438/275 |
| 2001/0003364 | A1 | * | 6/2001 | Sugawara et al. .......... 257/192 |

FOREIGN PATENT DOCUMENTS

| JP | 09-219524 | 8/1997 |
| JP | 11-340337 | 12/1999 |
| JP | 2001-257351 | 9/2001 |

OTHER PUBLICATIONS

Kern Rim et al., "Fabricating and Analysis of Deep Submicron Strained–Si N–MOSFET's", IEEE Transactions on Electron Devices, vol. 47, No. 7, Jul. 2000, pp. 1406–1415.
T. Mizuno et al., "Electron and Hole Mobility Enhancement in Strained–Si MOSFET's on SiGe–on–Insulator Substrates Fabricated by SIMOX Technology", IEEE Electron Device Letters, vol. 21, No. 5 May 2000, pp. 230–232.

* cited by examiner

Primary Examiner—David Nelms
Assistant Examiner—Andy Huynh
(74) Attorney, Agent, or Firm—Volentine Francos & Whitt, PLLC

(57) ABSTRACT

A MOSFET device including a semiconductor substrate, an SiGe layer provided on top of the semiconductor substrate, an Si layer provided on top of the SiGe layer; and a first isolation region for separating the Si layer into a first region and a second region, wherein the Si layer in the second region is turned into an Si epitaxial layer greater in thickness than the Si layer in the first region. The MOSFET device further includes at least one first MOSFET with the Si layer in the first region serving as a strained Si channel, and at least one second MOSFET with the Si epitaxial layer serving as an Si channel.

22 Claims, 8 Drawing Sheets

STRAINED SOI MOSFET DEVICE AND METHOD OF FABRICATING SAME

BACKGROUND OF THE INVENTION

1. Field of the Invention

The invention relates to a MOSFET device that is a semiconductor circuit including a strained SiMOSFET, and in particular, to a strained SOI MOSFET device using SiGe, and a method of fabricating the same.

2. Description of the Related Art

Improvement in the performance of a MOSFET is generally attained by miniaturization of a gate length. However, if the gate length is reduced to 0.1 μm or less, this will result in pronounced deterioration in mobility of current carriers, that is, electrons (or holes), due to enlargement of a perpendicular electric field created in the channel region of the MOSFET. Accordingly, a strained SiMOSFET (refer to IEEE Trans. Electron Devices, Vol. 47, No. 7, 2000, pp 1406–1415) capable of aiming at higher performance without depending solely on the miniaturization of the gate length has come to attract a lot of attention of the related industries as a LSI technology for the next generation. There has also been proposed a SOI strained SiMOSFET (refer to IEEE Electron Device Letters, Vol.21, No. 5, 2000, pp 230–232) aiming at improvement in driving force by reducing junction capacitance occurring at interfaces between highly doped diffusion layers and an Si substrate.

However, an SiGe layer formed underneath a strained Si layer, serving as the channel region of a strained SiMOSFET, has a very low thermal conductivity. For example, the SiGe layer, containing 20% of Ge in concentration, has a thermal conductivity on the order of one-fifteenth the thermal conductivity of the Si layer. Accordingly, in a state where the drain current of a transistor flows in large quantity, heat generated in the channel region as a result of self-heating is difficult to be diffused into the SiGe layer, so that there occurs an increase in resistance due to rise in the temperature of the channel region, thereby resulting in deterioration of the driving force of the strained SiMOSFET.

As is apparent from the drain current $I_D$—drain voltage $V_D$ characteristics of a MOSFET, schematically shown in FIG. 21, in the case of a structure or an operational condition, having a small self-heating effect (for example, in the case of the gate length being long, a gate width being narrow, or a power supply voltage being sufficiently low), a strained SiMOSFET (with the characteristics thereof as indicated by solid lines in FIG. 21) can obtain a large drain current as compared with a common MOSFET (with the characteristics thereof as indicated by broken lines in FIG. 21). In contrast, as is apparent from the drain current $I_D$—drain voltage $V_D$ characteristics of a MOSFET, schematically shown in FIG. 22, in the case of a structure or an operational condition, having a large self-heating effect (for example, in the case of the gate length being short and the width being not less than several μm, or the power supply voltage being high), a strained SiMOSFET (with the characteristics thereof as indicated by solid lines in FIG. 22) can obtain drain current only equivalent to, or not more than that for the common MOSFET (with the characteristics thereof as indicated by broken lines in FIG. 22).

With LSIs, by providing a step-down circuit, and so forth, internally, in recent years, a low voltage low current operation is executed in high-speed processing parts (core regions), however, a high power supply voltage as well as flow of a large drain current is required in data input-output parts (interface regions or I/O regions) so as to match requirements of peripheral equipment. For this reason, in the case of forming a LSI using a strained SiMOSFET, it is anticipated that the performance (data processing speed) of the LSI cannot be fully enhanced due to insufficient driving force in the I/O regions although the driving force of the core regions is enhanced.

SUMMARY OF THE INVENTION

Under the circumstances, the invention has been developed to resolve the above-described problems encountered in the case of using the conventional technology, and it is an object of the invention to provide a MOSFET capable of aiming at enhancement in data processing speed by forming a strained SiMOSFET in regions of a low driving voltage and a common MOSFET in regions of a high driving voltage, and a method of fabricating the same.

A MOSFET device according to the invention is a device comprising a semiconductor substrate, an SiGe layer provided on top of the semiconductor substrate, a Si layer provided on top of the SiGe layer, and a first isolation region for achieving separation of the Si layer between a first region and a second region, wherein the Si layer in the second region is turned into an Si epitaxial layer larger in thickness than the Si layer in the first region. The MOSFET device according to the invention comprises at least one first MOSFET with the Si layer in the first region, serving as a strained Si channel, and at least one second MOSFET with the Si epitaxial layer serving as an Si channel.

Further, a first method of fabricating a MOSFET device according to the invention comprises the steps of forming an SiGe layer on a semiconductor substrate, forming a Si layer on the SiGe layer, forming a first isolation region for achieving separation of the Si layer between a first region and a second region, forming an Si epitaxial layer larger in thickness than the Si layer in the first region by causing the Si layer in the second region to undergo selective epitaxial growth, and forming at least one first MOSFET with the Si layer in the first region, serving as a strained Si channel, and at least one second MOSFET with the Si epitaxial layer serving as an Si channel.

Still further, a second method of fabricating a MOSFET device according to the invention comprises the steps of forming an SiGe layer on a semiconductor substrate, forming a Si layer on the SiGe layer, forming a first isolation region for achieving separation of the Si layer between a first region and a second region, etching away the Si layer in the second region and an upper part of the SiGe layer underlying the Si layer in the second region, forming an Si epitaxial layer larger in thickness than the Si layer in the first region by causing the Si layer in the second region to undergo selective epitaxial growth on top of a remaining portion of the SiGe layer, and forming at least one first MOSFET with the Si layer in the first region, serving as a strained Si channel, and at least one second MOSFET with the Si epitaxial layer serving as an Si channel.

Yet further, a third method of fabricating a MOSFET device according to the invention comprises the steps of forming an SiGe layer on a semiconductor substrate, forming a Si layer on the SiGe layer, forming a first isolation region for achieving separation of the Si layer between a first region and a second region, forming an Si epitaxial layer larger in thickness than the Si layer in the first region by causing the Si layer in the second region to undergo selective epitaxial growth, forming a second isolation region for achieving separation of the Si epitaxial layer between a third region and a fourth region, and forming at least one first MOSFET with the Si layer in the first region, serving as a strained Si channel, and at least one second MOSFET with the Si epitaxial layer serving as an Si channel, in the third region and the fourth region, respectively.

Furthermore, a fourth method of fabricating a MOSFET device according to the invention comprises the steps of forming an SiGe layer on a semiconductor substrate, forming a Si layer on the SiGe layer, forming a first isolation region for achieving separation of the Si layer between a first region and a second region, etching away the Si layer in the second region and an upper part of the SiGe layer underlying the Si layer in the second region, forming an Si epitaxial layer larger in thickness than the Si layer in the first region by causing the Si layer in the second region to undergo selective epitaxial growth on top of a remaining portion of the SiGe layer, forming a second isolation region for achieving separation of the Si epitaxial layer between a third region and a fourth region, and forming at least one first MOSFET with the Si layer in the first region, serving as a strained Si channel, and at least one second MOSFET with the Si epitaxial layer serving as an Si channel, in the third region and the fourth region, respectively.

With respect to the first to fourth methods of fabricating the MOSFET device, respectively, the SiGe layer underlying the Si epitaxial layer may be rendered smaller in thickness than the SiGe layer underlying the Si layer in the first region.

Further, with respect to the third and fourth methods of fabricating the MOSFET device, respectively, the second isolation region may have a depth short of reaching the bottom of the Si epitaxial layer.

Still further, the first to fourth methods of fabricating the MOSFET device, respectively, may further comprise the steps of forming a hole penetrating through the SiGe layer to thereby link the Si epitaxial layer with the semiconductor substrate 41, and forming an embedded plug made of material, having a thermal conductivity higher than that of the SiGe layer, inside the hole.

DETAILED DESCRIPTION OF THE PREFERRED EMBODIMENTS

FIGS. 1 through 7 are schematic cross-sectional views illustrating steps of a process of fabricating a first embodiment of a MOSFET device according to the invention, respectively.

Figure 8:
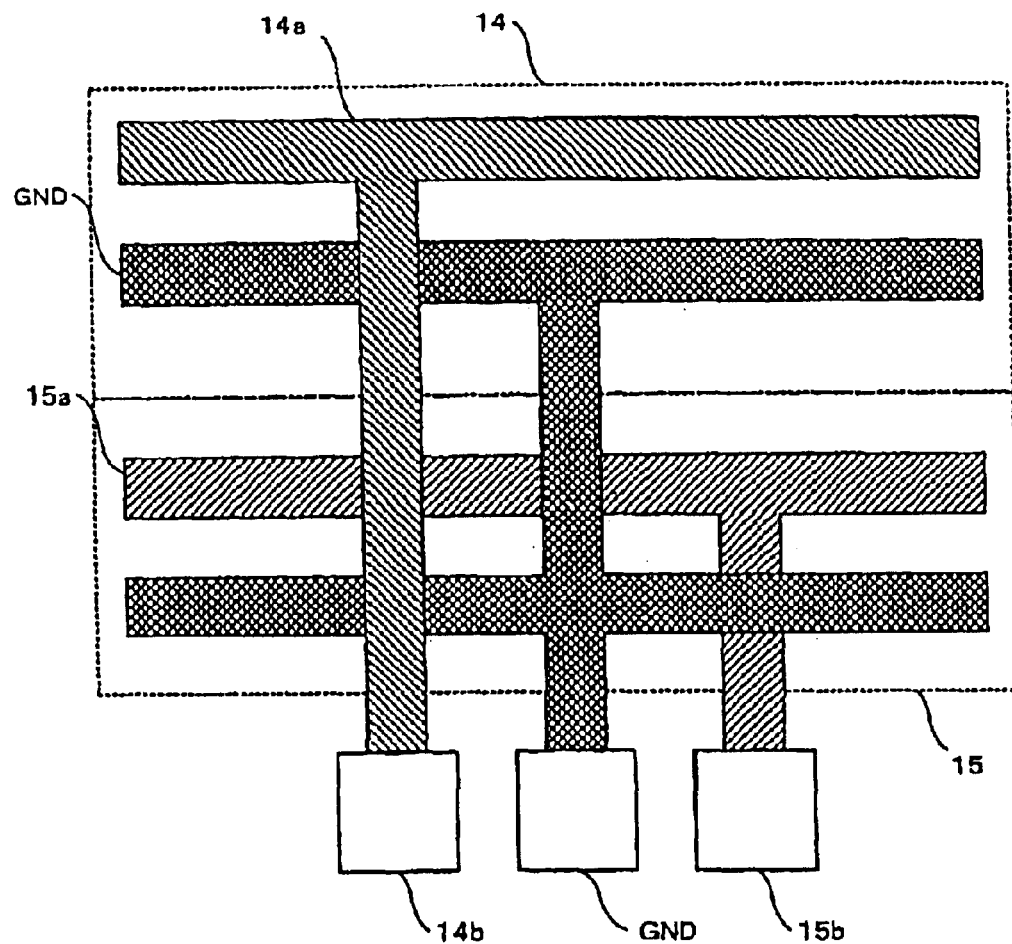
FIG. 8 is a plan view schematically illustrating the structure of a power supply line of a core region and an I/O region, respectively, with reference to the MOSFET device according to the first embodiment.

The MOSFET device according to the first embodiment is, for example, a LSI, and has high speed processing parts (core regions) where high-speed data processing is required at a low voltage, and data input-output parts (interface regions or I/O regions), that is, regions other than the core regions, where a power supply voltage is high. FIG. 8 is a plan view schematically illustrating the structure of a power supply line of a core region 14 and an I/O region 15, respectively, with reference to the MOSFET device according to the first embodiment. As shown in FIG. 8, the core region 14 is provided with a ground wiring GND and a core power source wiring 14a. Further, the I/O region 15 is provided with a ground wiring GND and an I/O power source wiring 15a. A core driving voltage $V_{CORE}$ is supplied to the core region 14 via a core power source terminal (or a core power source circuit) 14b and the core power source wiring 14a. An I/O driving voltage VI/O is supplied to the I/O region 15 via an I/O power source terminal (or an I/O power source circuit) 15b and the I/O power source wiring 15a. With the first embodiment, the core driving voltage $V_{CORE}$ is set at a value lower than that for the I/O driving voltage $V_{I/O}$. For example, the core driving voltage $V_{CORE}$ is at 1.5V while the I/O driving voltage $V_{I/O}$ is at 3.3V (or 2.5V).

Figure 1:
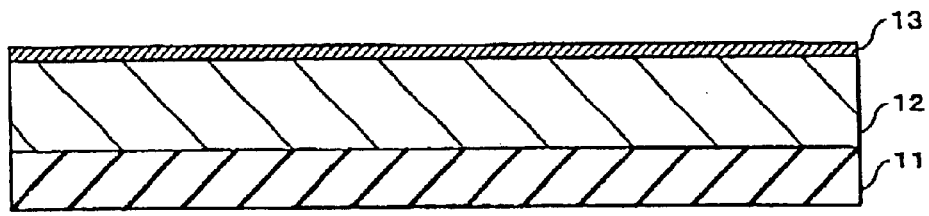
FIG. 1 is a schematic cross-sectional view for illustrating a step of a process of fabricating a first embodiment of a MOSFET device according to the invention.

In the fabrication of the MOSFET device according to the first embodiment, an SiGe (silicon-germanium) layer 12 is first formed on a semiconductor substrate (silicon wafer) 11, and on top of the SiGe layer 12, a thin Si (silicon) layer 13 to serve as an Si channel is formed as shown in FIG. 1. The thickness of the SiGe layer 12 is normally in a range of 200 nm to several $\mu$m, but is not limited to such as a range as described. The thickness of the Si layer 13 is normally in a range of 10 to 30 nm. An SOI substrate may be used for the semiconductor substrate 11.

Figure 2:
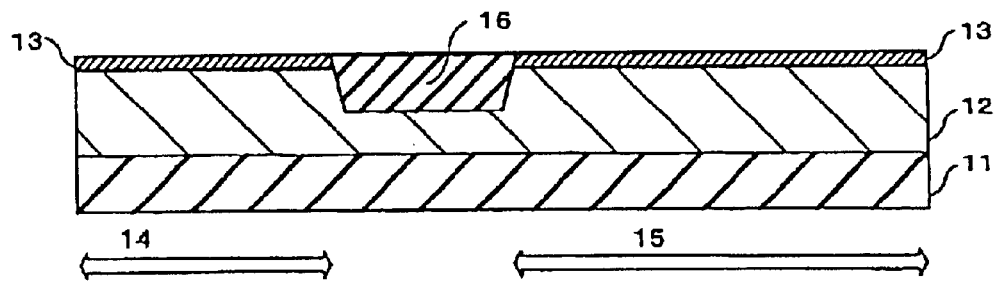
FIG. 2 is a schematic cross-sectional view for illustrating a step of the process of fabricating the MOSFET device according to the first embodiment, following the step shown in FIG. 1.
Figure 3:
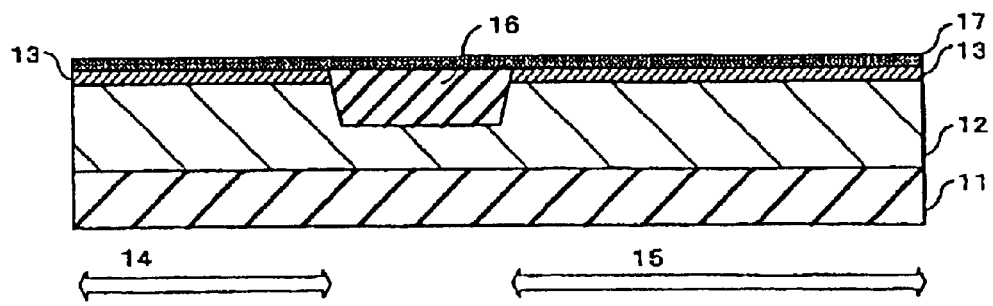
FIG. 3 is a schematic cross-sectional view for illustrating a step of the process of fabricating the MOSFET device according to the first embodiment, following the step shown in FIG. 2.
Figure 4:
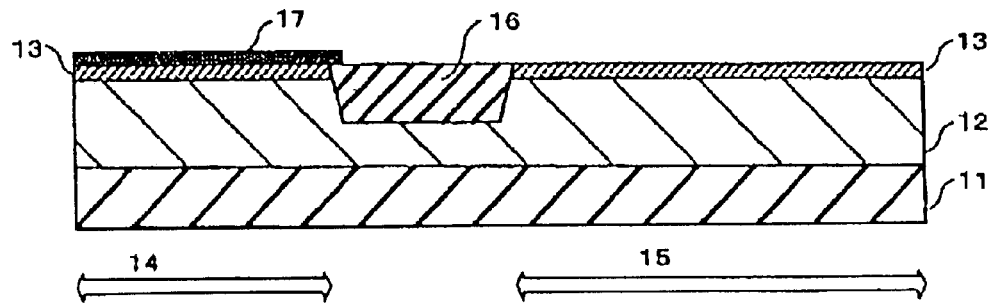
FIG. 4 is a schematic cross-sectional view for illustrating a step of the process of fabricating the MOSFET device according to the first embodiment, following the step shown in FIG. 3.
Figure 5:
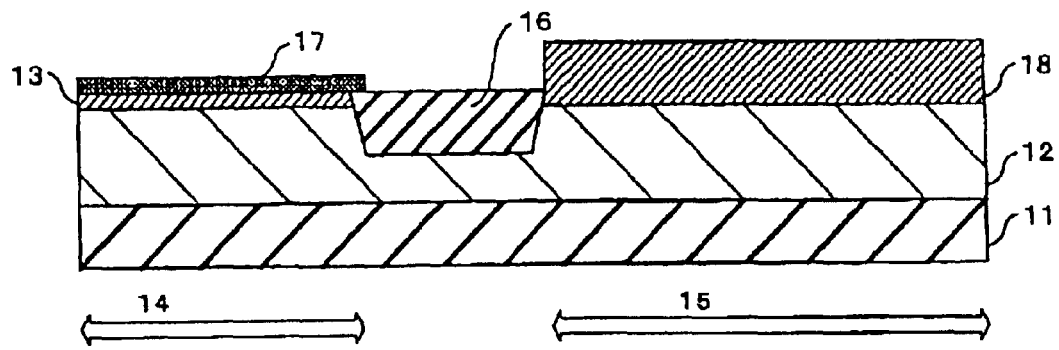
FIG. 5 is a schematic cross-sectional view for illustrating a step of the process of fabricating the MOSFET device according to the first embodiment, following the step shown in FIG. 4.

Subsequently, as shown in FIG. 2, an isolation region 16 is formed to achieve separation of the Si layer 13 between the core region 14 and the I/O region 15, that is, a region other than the core region 14. The isolation region 16 is formed by, for example, the Shallow Trench Isolation (STI) process, however, the isolation region 16 may be formed by other processes such as the LOCOS (Local Oxidation of Silicon) process, and so forth.

Figure 6:
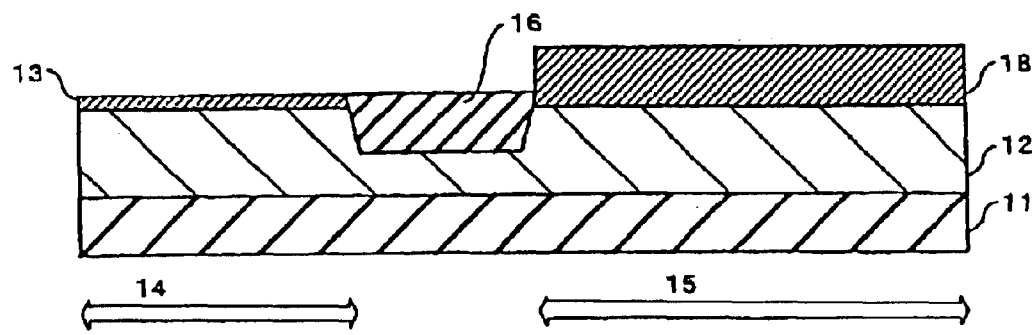
FIG. 6 is a schematic cross-sectional view for illustrating a step of the process of fabricating the MOSFET device according to the first embodiment, following the step shown in FIG. 5.

Next, by the process comprising the steps as shown in FIGS. 3 through 6, respectively, the Si layer 13 in the I/O region 15 is caused to undergo selective epitaxial growth, thereby forming an Si epitaxial layer 18 (FIG. 6) thicker than the Si layer 13 in the core region 14. In this case, the Si epitaxial layer 18 is formed by the process comprising the steps of forming a mask oxide film 17, serving as a growth stopping film, on top of an entire surface including the surface of the Si layer 13, and that of the isolation region 16 (FIG. 3), patterning the mask oxide film 17 by a photolithographic process and etching such that the mask oxide film 17 is left out on top of only the Si layer 13 in the core region 14 (FIG. 4), causing the Si layer in the I/O region 15 to undergo the epitaxial growth (FIG. 5), and removing the mask oxide film 17 (FIG. 6).

Figure 7:
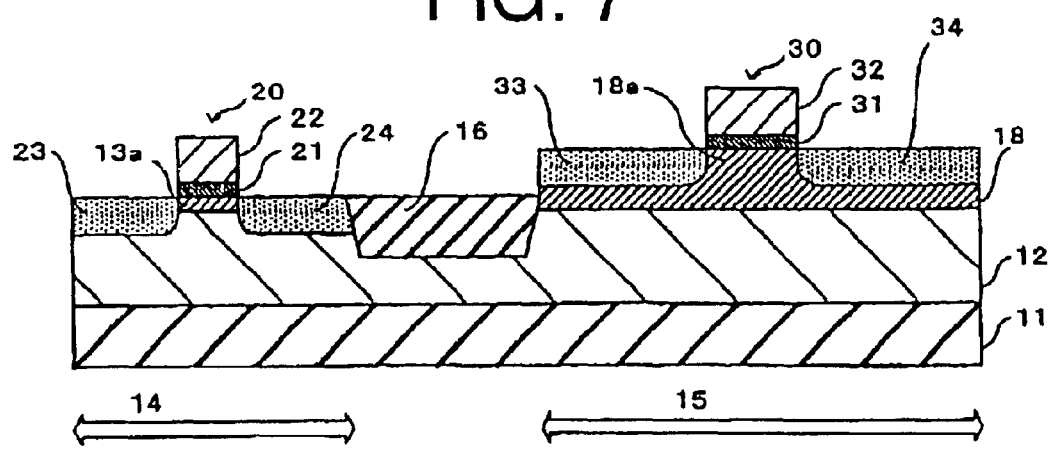
FIG. 7 is a schematic cross-sectional view for illustrating a step of the process of fabricating the MOSFET device according to the first embodiment, following the step shown in FIG. 6.

Subsequently, as shown in FIG. 7, by the normal process of fabricating a MOSFET, there are formed at least one strained SiMOSFET 20 (only one strained SiMOSFET 20 is shown in FIG. 7) with the Si layer 13 in the core region 14, serving as a strained Si channel 13a, and at least one MOSFET 30 (only one MOSFET 30 is shown in FIG. 7) with the Si epitaxial layer 18 in the I/O region 15, serving as an Si channel 18a. The strained SiMOSFET 20 and MOSFET 30 may be concurrently formed by the same process or sequentially by different processes, respectively.

As shown in FIG. 7, the strained SiMOSFET 20 comprises a gate oxide film 21, a gate electrode layer 22, a source region 23 and a drain region 24, formed by implantation of dopants (for example, As, B, etc.), and the strained Si channel 13a. Also, as shown in FIG. 7, the MOSFET 30 comprises a gate oxide film 31, a gate electrode layer 32, a source region 33 and a drain region 34, formed by implantation of dopants (for example, As, B, etc.), and the normal Si channel 18a (that is, other than a strained Si channel). With the strained SiMOSFET 20 in the core region 14, a gate length is on the order of 0.15 $\mu$m, and a gate width is in a range of about 0.2 to 0.4 $\mu$m, but those dimensions are not limited thereto. Further, with the MOSFET 30 in the I/O region 15, a gate length is in a range of about 0.25 to 0.3 $\mu$m, and a gate width is on the order of several tens of $\mu$m (from 10 to 40 $\mu$m), but those dimensions are not limited thereto.

As described in the foregoing, the MOSFET device according to the first embodiment comprises at least one strained SiMOSFET 20 with the Si layer 13 in the core region 14, serving as the strained Si channel 13a, and at least one MOSFET 30 in the I/O region 15, with the Si epitaxial layer 18 in the I/O region 15, thicker than the Si layer 13 in the core region 14, serving as the Si channel 18a. Accordingly, if the core region 14 is rendered to be a region where high-speed data processing is required at a low voltage, and the I/O region 15 is rendered to be a region where a power supply voltage is high, it is possible to implement faster processing in the core region 14, and to lessen deterioration in driving force, due to self-heating in the I/O region 15, so that higher performance of the MOSFET device (enhancement in data processing speed) can be attained.

Second Embodiment

FIGS. 9 through 15 are schematic cross-sectional views illustrating steps of a process of fabricating a second embodiment of a MOSFET device according to the invention, respectively The MOSFET device according to the second embodiment is, for example, a LSI, and has high speed processing parts (core regions) where high-speed data processing is required at a low voltage, and data input-output parts (interface regions or I/O regions), that is, regions other than the core regions, where a power supply voltage is high. With reference to the MOSFET device according to the second embodiment, the structure of a power supply line of a core region 44 and an I/O region 45, respectively, is the same as that for the first embodiment described above.

Figure 9:
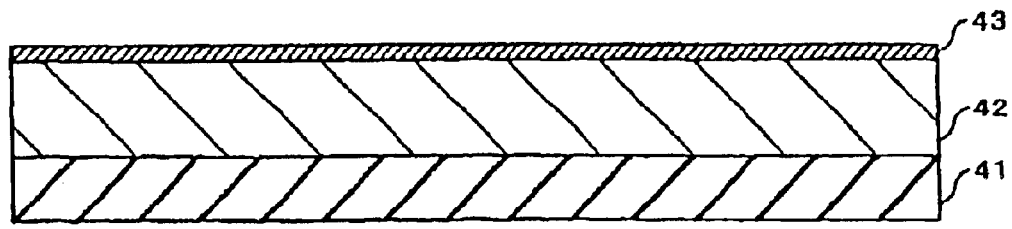
FIG. 9 is a schematic cross-sectional view for illustrating a step of a process of fabricating a second embodiment of a MOSFET device according to the invention.

In the fabrication of the MOSFET device according to the second embodiment, an SiGe (silicon-germanium) layer 42 is first formed on a semiconductor substrate (silicon wafer) 41, and on top of the SiGe layer 42, a thin Si (silicon) layer 43 to serve as an Si channel is formed as shown in FIG. 9. The thickness of the SiGe layer 42 is normally in a range of 200 nm to several $\mu$m, but is not limited to such a range as described. The thickness of the Si layer 43 is normally in a range of 10 to 30 nm. An SOI substrate may be used for the semiconductor substrate 41.

Figure 10:
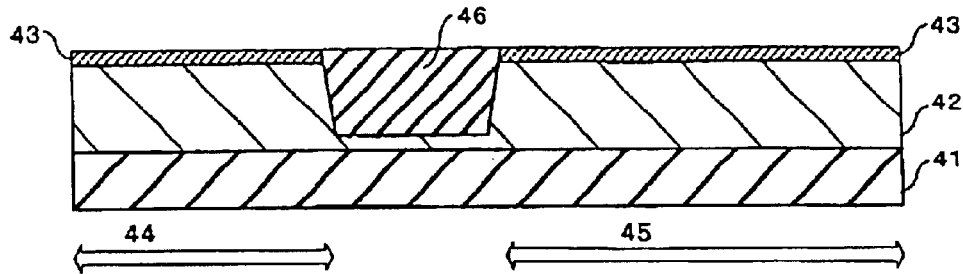
FIG. 10 is a schematic cross-sectional view for illustrating a step of the process of fabricating the MOSFET device according to the second embodiment, following the step shown in FIG. 9.

Subsequently, as shown in FIG. 10, an isolation region 46 is formed to achieve separation of the Si layer 43 between the core region 44 and the I/O region 45, that is, a region other than the core region 44. The isolation region 46 is formed by, for example, the STI process. However, the isolation region 16 may be formed by other processes such as the LOCOS process, and so forth.

Figure 11:
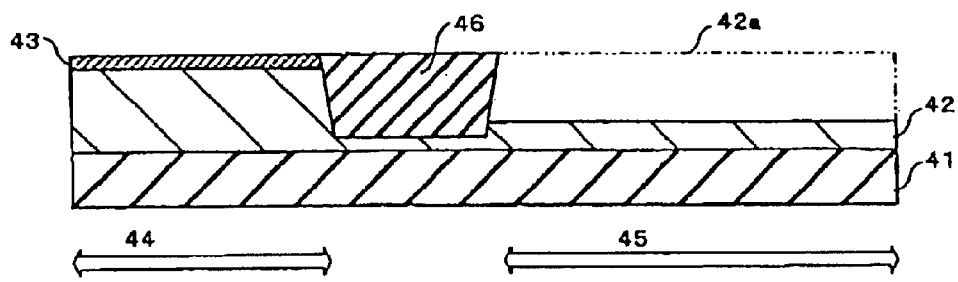
FIG. 11 is a schematic cross-sectional view for illustrating a step of the process of fabricating the MOSFET device according to the second embodiment, following the step shown in FIG. 10.

Next, as shown in FIG. 11, the Si layer 43 in the I/O region 45 and an upper part of the SiGe layer 42 underlying the Si layer 43 in the I/O region 45 are etched away In FIG.

11, an etched portion (indicated by a dash and double-dotted line) is denoted by reference numeral 42a.

Figure 12:
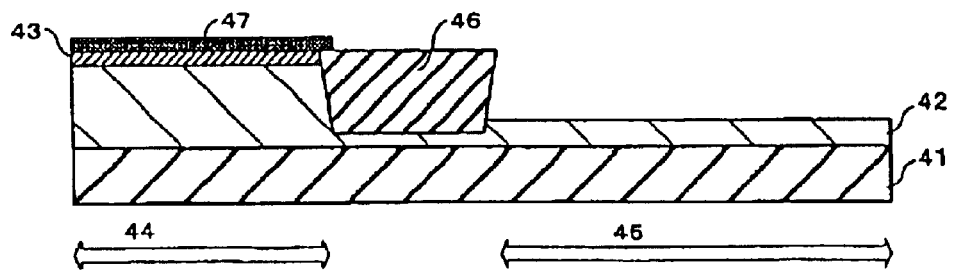
FIG. 12 is a schematic cross-sectional view for illustrating a step of the process of fabricating the MOSFET device according to the second embodiment, following the step shown in FIG. 11.
Figure 13:
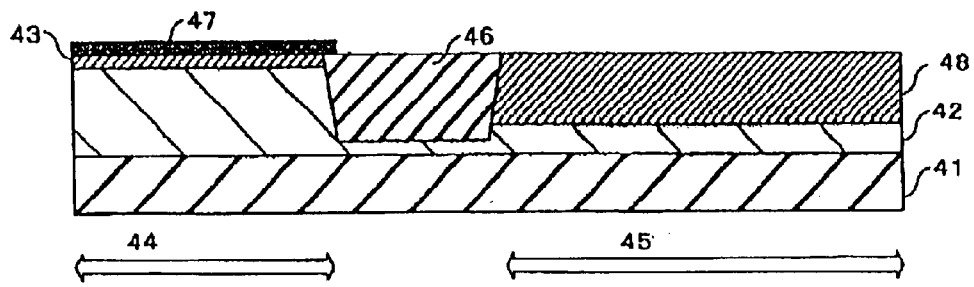
FIG. 13 is a schematic cross-sectional view for illustrating a step of the process of fabricating the MOSFET device according to the second embodiment, following the step shown in FIG. 12.
Figure 14:
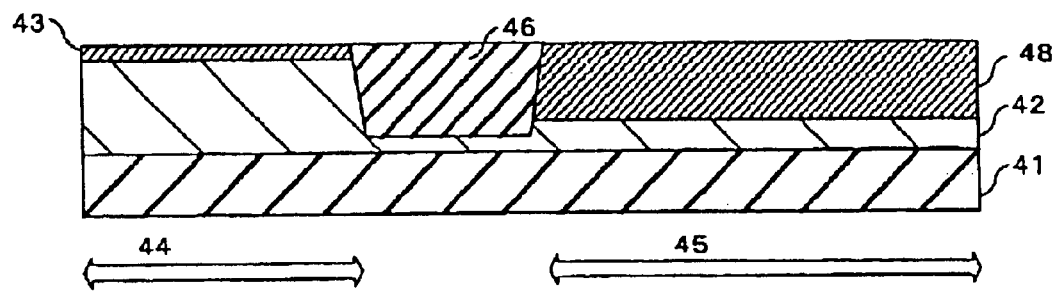
FIG. 14 is a schematic cross-sectional view for illustrating a step of the process of fabricating the MOSFET device according to the second embodiment, following the step shown in FIG. 13.

Next, by the process comprising the steps as shown in FIGS. 12 through 14, respectively, a Si layer is caused to undergo selective epitaxial growth in the I/O region 45, thereby forming an Si epitaxial layer 48 thicker than the Si layer 43 in the core region 44. The upper surface of the Si epitaxial layer 48 is rendered substantially at the same level as the upper surface of the Si layer 43.

The process comprises the steps of forming a mask oxide film 47 serving as a growth stopping film on top of the entire surface including the surface of the Si layer 43, that of the isolation region 46 (FIG. 3), and that of the SiGe layer 42, patterning the mask oxide film 47 by a photolithographic process and etching such that the mask oxide film 47 is left out on top of only the Si layer 43 in the core region 44 (FIG. 12), causing the Si layer to undergo the epitaxial growth on top of the SiGe layer 42 in the I/O region 45 (FIG. 13), and removing the mask oxide film 47 (FIG. 14). However, the process of forming the Si epitaxial layer 48 by causing selective epitaxial growth in the I/O region 45 is not limited to the steps described above.

Figure 15:
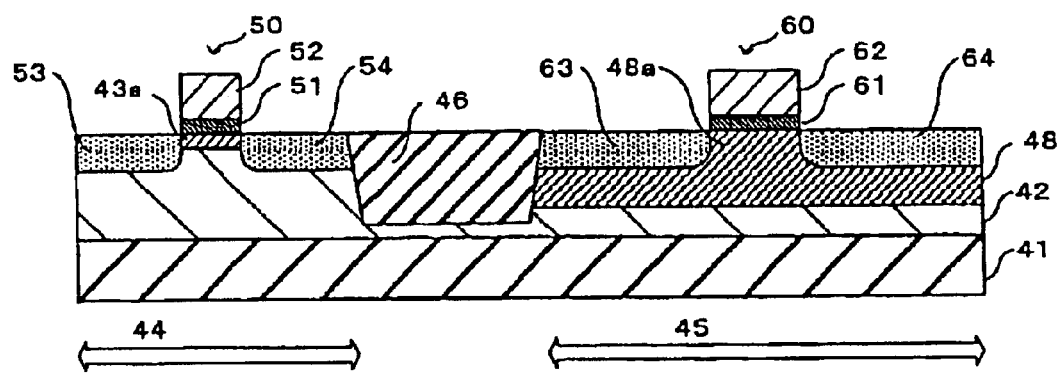
FIG. 15 is a schematic cross-sectional view for illustrating a step of the process of fabricating the MOSFET device according to the second embodiment, following the step shown in FIG. 14.

Subsequently, as shown in FIG. 15, by the normal process of fabricating a MOSFET, there are formed at least one strained SiMOSFET 50 (only one strained SiMOSFET 50 is shown in FIG. 15) with the Si layer 43 in the core region 44, serving as a strained Si channel 43a, and at least one MOSFET 60 (only one MOSFET 60 is shown in FIG. 15) with the Si epitaxial layer 48 in the I/O region 45, serving as an Si channel 48a. The strained SiMOSFET 50 and MOSFET 60 may be concurrently formed by the same process or sequentially by different processes, respectively.

As shown in FIG. 15, the strained SiMOSFET 50 comprises a gate oxide film 51, a gate electrode layer 52, a source region 53 and a drain region 54, formed by implantation of dopants (for example, As, B, etc.), and the strained Si channel 43a. Also, as shown in FIG. 15, the MOSFET 60 comprises a gate oxide film 61, a gate electrode layer 62, a source region 63 and a drain region 64, formed by implantation of dopants (for example, As, B, etc.), and the normal Si channel 48a (that is, other than a strained Si channel). With those MOSFETs described above, respective gate lengths and gate widths are the same as those for the first embodiment.

As described in the foregoing, the MOSFET device according to the second embodiment comprises at least one strained SiMOSFET 50 in the core region 44, with the Si layer 43 serving as the strained Si channel 43a, and at least one MOSFET 60 in the I/O region 15, with the Si epitaxial layer 48 thicker than the Si layer 43 in the core region 44, serving as the Si channel 48a. Accordingly, if the core region 44 is rendered to be the core region of the LSI, where high-speed data processing is required at a low voltage, and the I/O region 45 is rendered to be the I/O region of the LSI, where a power supply voltage is high, it is possible to implement faster data processing in the core region 44, and to lessen deterioration in driving force, due to self-heating in the I/O region 45, so that higher performance of the MOSFET device (enhancement in the data processing speed) can be attained.

Further, with the second embodiment of the invention, since the Si epitaxial layer 48 to be formed in the I/O region 45 is formed in the etched portion 42a of the Si layer 43 and the SiGe layer 42, a difference in level between the core region 44 and the I/O region 45 can be decreased or eliminated. Hence, it is possible to apply the photolithographic process to be repeated in the later steps of fabricating the MOSFET device to both the core region 44 and the I/O region 45 all together, thereby enabling the steps of fabrication to be drastically cut back.

Third Embodiment

Figure 16:
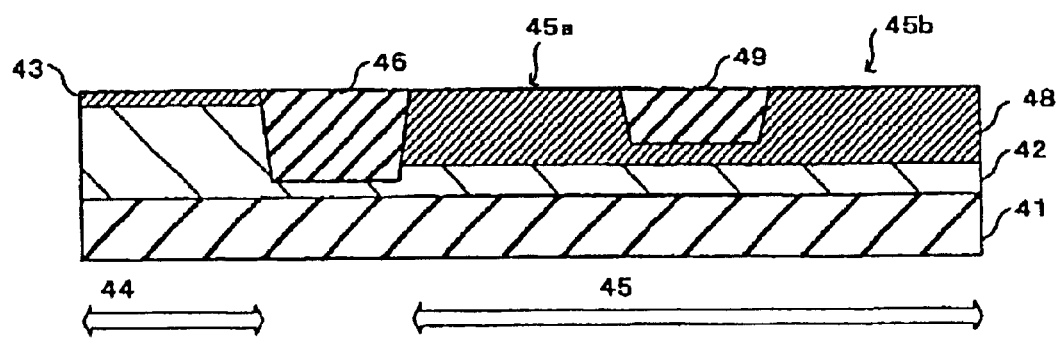
FIG. 16 is a schematic cross-sectional view for illustrating a step of a process of fabricating a third embodiment of a MOSFET device according to the invention.
Figure 17:
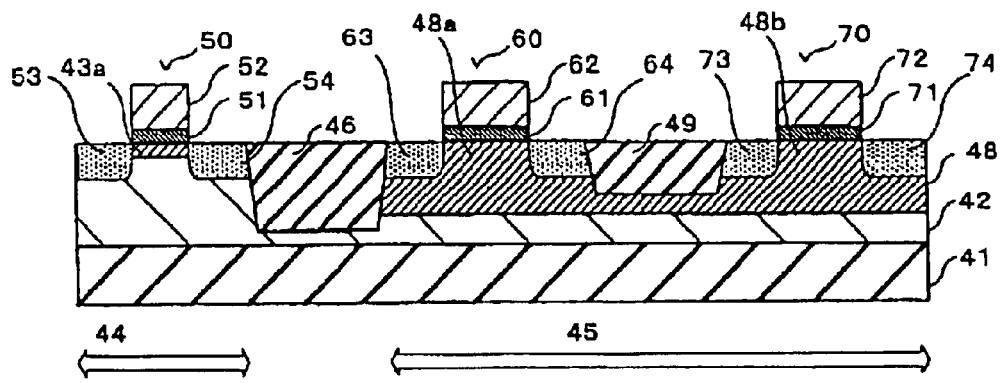
FIG. 17 is a schematic cross-sectional view for illustrating a step of the process of fabricating the MOSFET device according to the third embodiment, following the step shown in FIG. 16.

FIGS. 16 and 17 are schematic cross-sectional views illustrating steps of a process of fabricating a third embodiment of a MOSFET device according to the invention, respectively.

Part of the process of fabricating the MOSFET device according to the third embodiment is the same as part of the process of fabricating the MOSFET device according to the second embodiment. Accordingly, the process of fabricating the MOSFET device according to the third embodiment will be described with reference to FIGS. 9 through 14 as well, which are referred to in the description of the second embodiment.

In the fabrication of the MOSFET device according to the third embodiment, a thin Si (silicon) layer 43 is formed in a core region 44 and a thick Si epitaxial layer 48 is formed in an I/O region 45 by the same process as that of fabricating the MOSFET device according to the second embodiment as shown in FIGS. 9 through 14.

Subsequently, as shown in FIG. 16, there is formed an isolation region 49 for achieving separation of the Si epitaxial layer 48 into two regions, that is, regions 45a, 45b. The isolation region 49 has a depth short of reaching the bottom of the Si epitaxial layer 48, and the two regions of the Si epitaxial layer 48, that is, the regions 45a, 45b are linked with each other underneath the isolation region 49.

Subsequently, as shown in FIG. 17, by the normal process of fabricating a MOSFET, there are formed at least one strained SiMOSFET 50 (only one strained SiMOSFET 50 is shown in FIG. 17) with the Si layer 43 in the core region 44, serving as a strained Si channel 43a, at least one MOSFET 60 (only one MOSFET 60 is shown in FIG. 17) with the Si epitaxial layer 48 in the region 45a of the I/O region 45, serving as an Si channel 48a, and at least one MOSFET 70 (only one MOSFET 70 is shown in FIG. 17) with the Si epitaxial layer 48 in the region 45b of the I/O region 45, serving as an Si channel 48b.

As shown in FIG. 17, the strained SiMOSFET 50 comprises a gate oxide film 51, a gate electrode layer 52, a source region 53 and a drain region 54, formed by implantation of dopants (for example, As, B, etc.), and the strained Si channel 13a. Also, as shown in FIG. 17, the MOSFET 60 comprises a gate oxide film 61, a gate electrode layer 62, a source region 63 and a drain region 64, formed by implantation of dopants (for example, As, B, etc.), and the normal Si channel 48a (that is, other than a strained Si channel). Further, as shown in FIG. 17, the MOSFET 70 comprises a gate oxide film 71, a gate electrode layer 72, a source region 73 and a drain region 74, formed by implantation of dopants (for example, As, B, etc.), and the normal Si channel 48a (that is, other than a strained Si channel). With those MOSFETs described above, respective gate lengths and gate widths are the same as those for the first embodiment.

As described in the foregoing, the MOSFET device according to the third embodiment comprises at least one strained SiMOSFET 50 in the core region 44, with the Si layer 43 serving as the strained Si channel 43a, at least one MOSFET 60 in the region 45a of the I/O region 45, with the Si epitaxial layer 48 thicker than the Si layer 43 in the core region 44, serving as the Si channel 48a, and at least one MOSFET 70 in the region 45b of the I/O region 45, with the Si epitaxial layer 48 thicker than the Si layer 43 in the core region 44, serving as the Si channel 48b. Accordingly, if the core region 44 is rendered to be a region where high-speed data processing is required at a low voltage, and the I/O region 45 is rendered to be a region where a power supply voltage is high, it is possible to implement faster data processing in the core region 44, and to lessen deterioration in driving force, due to self-heating in the I/O region 45, so that higher performance of the MOSFET device (enhancement in the data processing speed) can be attained.

Further, with the MOSFET device according to the third embodiment, the Si epitaxial layer 48 is continuous in the I/O region 45 underneath the isolation region 49. Because the Si epitaxial layer 48 has a thermal conductivity higher than that of an SiGe layer 42, heat generated when a transistor is turned on can be diffused through the Si epitaxial layer 48. As a result, the deterioration in the driving force, due to self-heating in the I/O region 45, can be lessened, so that higher performance of the MOSFET device (enhancement in the data processing speed) can be attained.

Still further, with the third embodiment of the invention, since the Si epitaxial layer 48 to be formed in the I/O region 45 is formed in an etched portion 42a where the Si layer 43 and a potion of the SiGe layer 42 are etched away, a difference in level between the core region 44 and the I/O region 45 can be decreased or eliminated. Hence, it is possible to apply the photolithographic process to be repeated in the later steps of fabricating the MOSFET device to both the core region 44 and the I/O region 45 all together, thereby enabling the steps of fabrication to be drastically cut back.

Furthermore, in the description described above, there has been described a case where the isolation region 49, the MOSFET 60, and the MOSFET 70 are formed in the I/O region 45 shown in FIG. 14 (the second embodiment), however, the isolation region and the MOSFETs may be formed in the I/O region 15 shown in FIG. 6 (the first embodiment) by the same process of fabrication as that for the third embodiment.

Fourth Embodiment

Figure 18:
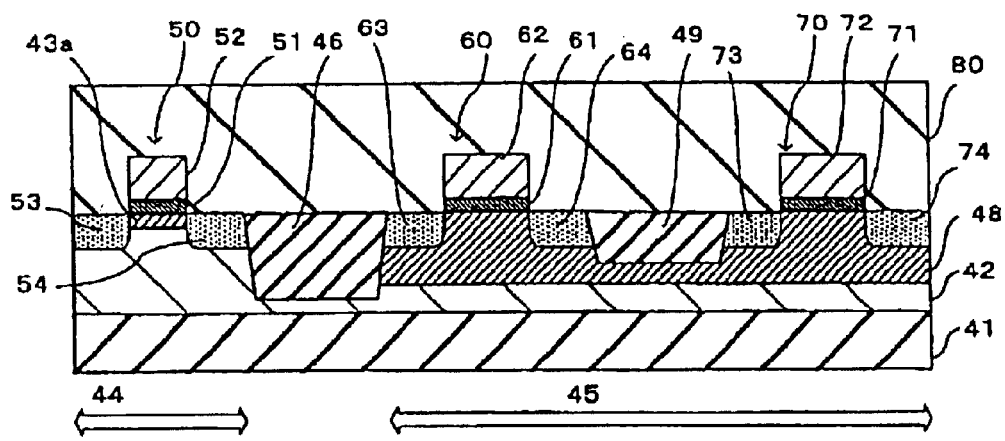
FIG. 18 is a schematic cross-sectional view for illustrating a step of a process of fabricating a fourth embodiment of a MOSFET device according to the invention.
Figure 19:
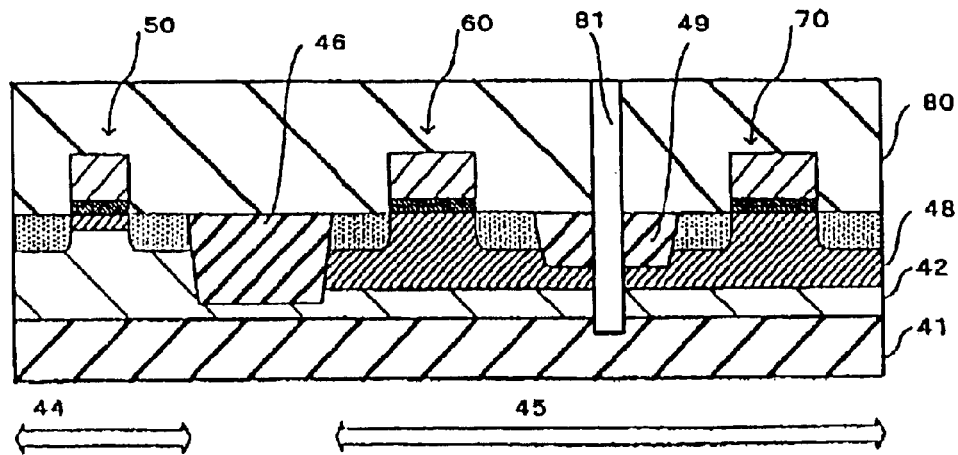
FIG. 19 is a schematic cross-sectional view for illustrating a step of the process of fabricating the MOSFET device according to the fourth embodiment, following the step shown in FIG. 18.
Figure 20:
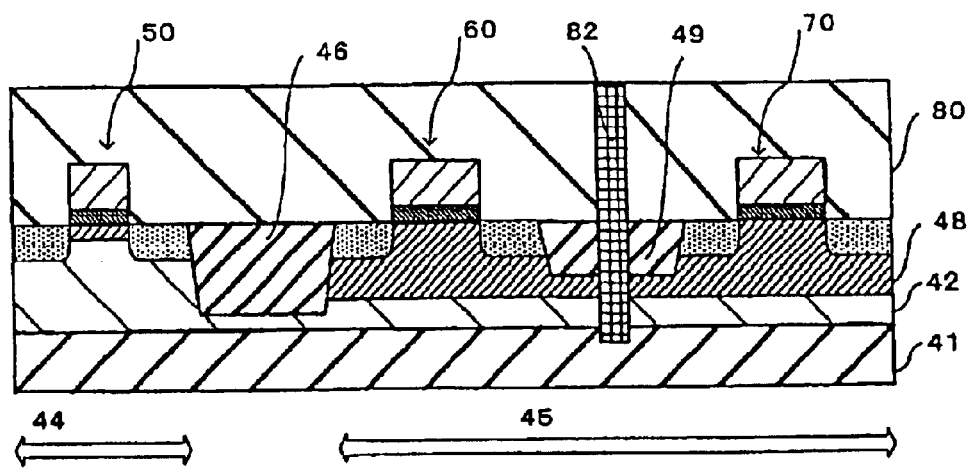
FIG. 20 is a schematic cross-sectional view for illustrating a step of the process of fabricating the MOSFET device according to the fourth embodiment, following the step shown in FIG. 19.
Figure 21:
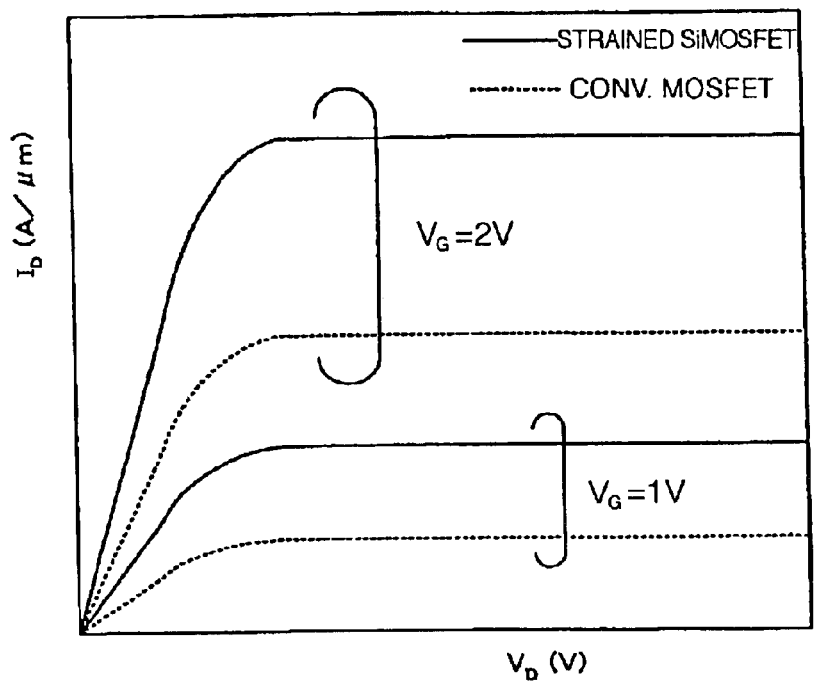
FIG. 21 is a diagram schematically showing the drain current $I_D$ —drain voltage $V_D$ characteristics of a MOSFET with deterioration in the driving force thereof, due to self-heating effect, being small.
Figure 22:
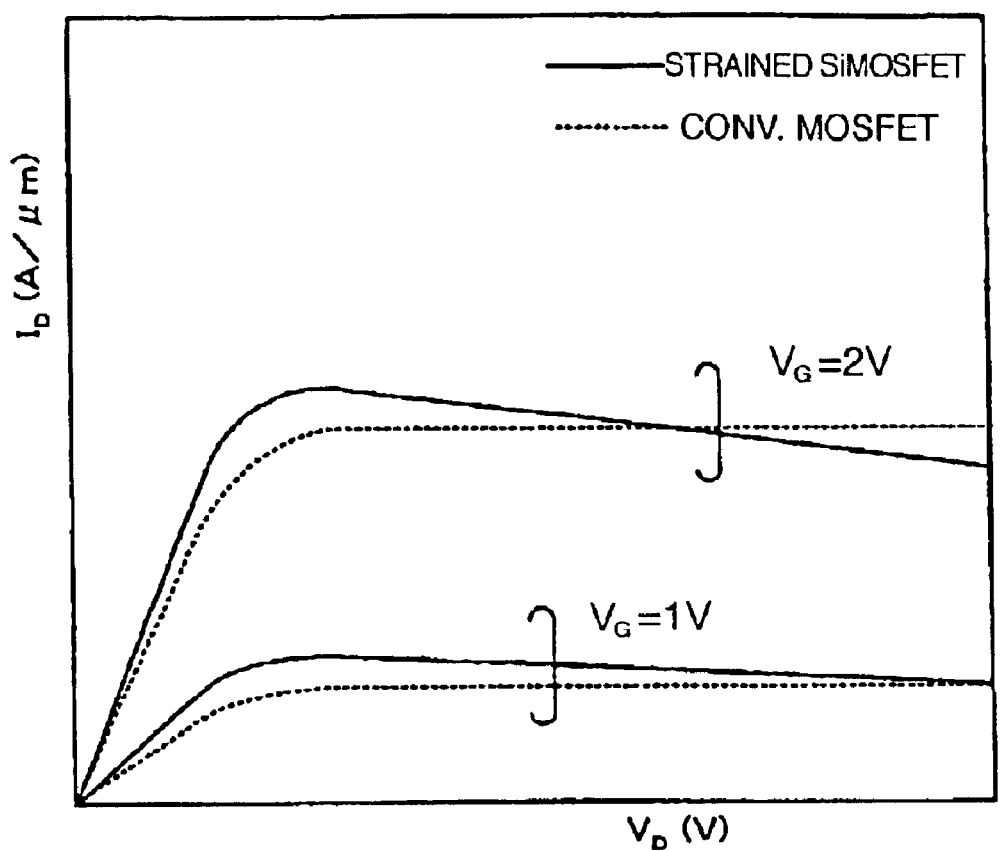
FIG. 22 is a diagram schematically showing the drain current $I_D$ —drain voltage $V_D$ characteristics of a MOSFET with deterioration in the driving force thereof, due to self-heating effect, being large.

FIGS. 18 through 20 are schematic cross-sectional views illustrating a process (the steps thereof, 1 through 3) of fabricating a fourth embodiment of a MOSFET device according to the invention.

The MOSFET device according to the fourth embodiment is a device improved on the MOSFET device according to the third embodiment. Accordingly, the process of fabricating the MOSFET device according to the fourth embodiment will be described with reference to FIG. 17 as well.

In the fabrication of the MOSFET device according to the fourth embodiment, there are formed at least one strained SiMOSFET 50 with a Si layer 43 in a core region 44, serving as a strained Si channel 43a, and at least one MOSFET 60, 70, respectively, with an Si epitaxial layer 48 in each of two regions of the I/O region 45, that is, 45a, 45b, serving as an Si channel 48a, 48b, respectively, as shown in FIG. 17, by the same process as that of fabricating the MOSFET device according to the third embodiment.

Subsequently, as shown in FIG. 18, an interlayer insulator 80 covering the respective MOSFETs 50, 60, 70 is formed.

Then, as shown in FIG. 19, using a photolithographic and etching techniques, there is formed a hole 81 that penetrates through the interlayer insulator 80, an isolation region 49, the Si epitaxial layer 48, and an SiGe layer 42, and reaches a semiconductor substrate 41.

In the next step, the hole 81 is filled up with material having a thermal conductivity higher than that of the SiGe layer, such as, for example, polysilicon, thereby forming an embedded plug 82. The shape of the embedded plug 82 as well as the hole 81 is not limited to a shape shown in the figure, and the embedded plug 82 as well as the hole 81 may be of any other structure capable of allowing heat to be dissipated from the Si epitaxial layer 48 to the semiconductor substrate 41 by linking the Si epitaxial layer 48 with the semiconductor substrate 41. Further, any other material such as a metallic material (for example, tungsten, aluminum, etc.) may be used as a constituent material of the embedded plug 82 provided that such a constituent material has a thermal conductivity higher than that of the SiGe layer.

As described in the foregoing, the MOSFET device according to the fourth embodiment comprises at least one strained SiMOSFET 50 in the core region 44, with the Si layer 43 serving as the strained Si channel 43a, at least one MOSFET 60 in the region 45a of the I/O region 45, with the Si epitaxial layer 48 thicker than the Si layer 43 in the core region 44, serving as the Si channel 48a, and at least one MOSFET 70 in the region 45b of the I/O region 45, with the Si epitaxial layer 48 thicker than the Si layer 43 in the core region 44, serving as the Si channel 48b. Accordingly, if the core region 44 is rendered to be the core region of a LSI, where high-speed data processing is required at a low voltage, and the I/O region 45 is rendered to be the I/O region of the LSI, where a power supply voltage is high, it is possible to implement faster processing in the core region 44, and to lessen deterioration in driving force, due to self-heating in the I/O region 45, so that higher performance of the MOSFET device (enhancement in data processing speed) can be attained.

Further, with the MOSFET device according to the fourth embodiment, since the Si epitaxial layer 48 is continuous underneath the isolation region 49 in the I/O region 45, heat generated when a transistor is turned on can be diffused through the Si epitaxial layer 48. As a result, the deterioration of the driving force, due to self-heating in the I/O region 45, can be lessened, so that higher performance of the MOSFET device (enhancement in the data processing speed) can be attained.

Still further, with the fourth embodiment of the invention, since the Si epitaxial layer 48 is linked with the semiconductor substrate 41 through the intermediary of the embedded plug 82, made of a constituent material having a thermal conductivity higher than that of the SiGe layer 42, heat generated when a transistor is turned on can be diffused through the Si epitaxial layer 48, and is conducted through the embedded plug 82 to be thereby diffused through the semiconductor substrate 41. As a result, the deterioration of the driving force, due to self-heating in the I/O region 45, can be lessened, so that higher performance of the MOSFET device (enhancement in the data processing speed) can be attained.

Furthermore, in the description described above, there has been described a case where the isolation region 49 and the embedded plug 82 are formed in the I/O region 45 shown in FIG. 14 (the second embodiment), however, the isolation region 49 and the embedded plug 82 may be formed in the I/O region 15 shown in FIG. 6 (the first embodiment).

What is claimed is:

1. A semiconductor device including a core region and an interface region, the semiconductor device comprising:
   a semiconductor substrate;
   an SiGe layer provided on the semiconductor substrate;
   an Si layer provided on the SiGe layer;
   a first isolation region for separating the Si layer into the core region and the interface region, wherein the Si layer in the interface region is turned into an Si epitaxial layer greater in thickness than the Si layer in the core region;

a first MOSFET with the Si layer in the core region serving as a strained Si channel; and a second MOSFET with the Si epitaxial layer in the interface region serving as an Si channel.

2. The semiconductor device according to claim 1, wherein the SiGe layer underlying the Si epitaxial layer is rendered smaller in thickness than the SiGe layer underlying the Si layer in the core region.

3. The semiconductor device according to claim 1, further comprising a second isolation region for separating the Si epitaxial layer in the interface region into a first region and a second region, wherein a plurality of said second MOSFETs are formed on said first region and said second region.

4. The semiconductor device according to claim 3, wherein the second isolation region has a depth short of reaching a bottom of the Si epitaxial layer.

5. The semiconductor device according to claim 1, further comprising an embedded plug made of a material having a thermal conductivity higher than that of the SiGe layer, formed inside a hole penetrating through the SiGe layer, to link the Si epitaxial layer with the semiconductor substrate.

6. The semiconductor device according to claim 5, wherein the material of the embedded plug is polysilicon.

7. The semiconductor device according to claim 1, wherein a first driving voltage is supplied to the first MOSFET and a second driving voltage which is greater than the first driving voltage is supplied to the second MOSFET.

8. A semiconductor device comprising:

a silicon substrate;

a silicon germanium layer formed on the silicon substrate;

a first isolation insulating layer formed on the silicon germanium layer so as to form a first region and a second region, the first isolation insulating layer having an element isolation function;

a silicon layer formed on the silicon germanium layer, the silicon layer having a first thickness in the first region and a second thickness in the second region, wherein the first thickness is less than the second thickness;

a first MOSFET formed on the silicon layer in the first region, the first MOSFET receiving a first driving voltage; and a second MOSFET formed on the silicon layer in the second region, the second MOSFET receiving a second driving voltage that is greater than the first driving voltage.

9. The semiconductor device according to claim 8, wherein the first isolation insulating layer partially separates the silicon germanium layer.

10. The semiconductor device according to claim 8, wherein surfaces of the silicon layer in the first and second regions are substantially coplanar.

11. The semiconductor device according to claim 8, wherein each of the first and second MOSFETs has a source/drain region having a third thickness that is between the first thickness and the second thickness.

12. The semiconductor device according to claim 8, further comprising an interlayer insulating layer formed on the first and second MOSFETs.

13. The semiconductor device according to claim 8, further comprising a second isolation insulating layer formed on the silicon germanium layer in the second region.

14. The semiconductor device according to claim 13, further comprising an embedded plug formed through the second isolation insulating layer and the silicon germanium layer to the silicon substrate.

15. A semiconductor integrated circuit device comprising:

a silicon substrate having a core region and an input/output region;

a silicon germanium layer formed on the silicon substrate;

a first isolation insulating layer formed on the silicon germanium layer, the first isolation insulating layer being located between the core region and the input/output region;

a silicon layer formed on the silicon germanium layer, the silicon layer having a first thickness in the core region and a second thickness in the input/output region, wherein the first thickness is less than the second thickness;

a first MOSFET formed on the silicon layer in the core region; and a second MOSFET formed on the silicon layer in the input/output region.

16. The semiconductor integrated circuit device according to claim 15, wherein the first MOSFET receives a first driving voltage and the second MOSFET receives a second driving voltage that is greater than the first driving voltage.

17. The semiconductor integrated circuit device according to claim 15, wherein the first isolation insulating layer partially separates the silicon germanium layer.

18. The semiconductor integrated circuit device according to claim 15, wherein surfaces of the silicon layer in the core and input/output regions are substantially coplanar.

19. The semiconductor integrated circuit device according to claim 15, wherein each of the first and second MOSFETs has a source/drain region having a third thickness that is between the first and second thicknesses.

20. The semiconductor integrated circuit device according to claim 15, further comprising an interlayer insulating layer formed on the first and second MOSFETs.

21. The semiconductor integrated circuit device according to claim 15, further comprising a second isolation insulating layer formed on the silicon germanium layer in the input/output region.

22. The semiconductor integrated circuit device according to claim 21, further comprising an embedded plug formed through the second isolation insulating layer and the silicon germanium layer to the silicon substrate.

* * * * *